(12) United States Patent
Gurary

(10) Patent No.: US 8,460,466 B2
(45) Date of Patent: Jun. 11, 2013

(54) EXHAUST FOR CVD REACTOR

(75) Inventor: Alex Gurary, Bridgewater, NJ (US)

(73) Assignee: Veeco Instruments Inc., Plainview, NY (US)

( * ) Notice: Subject to any disclaimer, the term of this patent is extended or adjusted under 35 U.S.C. 154(b) by 509 days.

(21) Appl. No.: 12/848,540

(22) Filed: Aug. 2, 2010

(65) Prior Publication Data

US 2012/0027936 A1  Feb. 2, 2012

(51) Int. Cl.
*C23C 16/00* (2006.01)
*C23C 16/455* (2006.01)
*C23C 16/458* (2006.01)
*C23C 16/46* (2006.01)

(52) U.S. Cl.
USPC ...... 118/715; 156/345.29; 118/728; 118/730; 118/724; 118/725

(58) Field of Classification Search
USPC ...... 118/715, 724, 725, 728, 730; 156/345.29
See application file for complete search history.

(56) References Cited

U.S. PATENT DOCUMENTS

| | | | | |
|---|---|---|---|---|
| 6,213,478 B1 * | 4/2001 | Nishikawa | ............ | 279/4.08 |
| 6,261,408 B1 | 7/2001 | Schneider et al. | | |
| 6,419,751 B1 * | 7/2002 | Nagashima | ............ | 118/715 |
| 6,531,069 B1 * | 3/2003 | Srivastava et al. | ............ | 216/67 |
| 6,902,623 B2 | 6/2005 | Gurary et al. | | |
| 7,276,124 B2 | 10/2007 | Gurary et al. | | |
| 7,865,995 B2 | 1/2011 | Mayer | | |
| 8,387,194 B2 | 3/2013 | Mayer | | |

FOREIGN PATENT DOCUMENTS

WO    2009148913 A2    12/2009

OTHER PUBLICATIONS

International Search Report and Written Opinion Application No. PCT/US2011/046215, dated Oct. 19, 2011.

* cited by examiner

*Primary Examiner* — Jeffrie R Lund
*Assistant Examiner* — Yuechuan Yu
(74) *Attorney, Agent, or Firm* — Lerner, David, Littenberg, Krumholz & Mentlik, LLP

(57) ABSTRACT

A chemical vapor deposition reactor and a method of wafer processing are provided. The reactor includes a reaction chamber having an interior, a gas inlet manifold communicating with the interior of the chamber, an exhaust system including an exhaust manifold having a passage and one or more ports, and one or more cleaning elements mounted within the chamber. The gas inlet manifold can admit process gasses to form a deposit on substrates held within the interior. The passage can communicate with the interior of the chamber through the one or more ports. The one or more cleaning elements are movable between (i) a run position in which the cleaning elements are remote from the one or more ports and (ii) a cleaning position in which the one or more cleaning elements are engaged in the one or more ports.

14 Claims, 5 Drawing Sheets

EXHAUST FOR CVD REACTOR

BACKGROUND OF THE INVENTION

The present invention relates to wafer processing apparatus, to exhaust systems for use in such processing apparatus, and to methods of cleaning the exhaust systems.

Many semiconductor devices are formed by processes performed on a substrate. The substrate typically is slab of a crystalline material, commonly referred to as a "wafer." Typically, a wafer is formed by depositing a crystalline material and is in the form of a disc. One common process for forming such a wafer is epitaxial growth.

For example, devices formed from compound semiconductors such as III-V semiconductors typically are formed by growing successive layers of the compound semiconductor using metal organic chemical vapor deposition or "MOCVD." In this process, the wafers are exposed to a combination of gases, typically including a metal organic compound as a source of a group III metal, and also including a source of a group V element which flow over the surface of the wafer while the wafer is maintained at an elevated temperature. Typically, the metal organic compound and group V source are combined with a carrier gas which does not participate appreciably in the reaction as, for example, nitrogen. One example of a III-V semiconductor is gallium nitride, which can be formed by reaction of an organo gallium compound and ammonia on a substrate having a suitable crystal lattice spacing, as for example, a sapphire wafer. Typically, the wafer is maintained at a temperature on the order of 500-1100° C. during deposition of gallium nitride and related compounds.

Composite devices can be fabricated by depositing numerous layers in succession on the surface of the wafer under slightly different reaction conditions, as for example, additions of other group III or group V elements to vary the crystal structure and bandgap of the semiconductor. For example, in a gallium nitride based semiconductor, indium, aluminum or both can be used in varying proportion to vary the bandgap of the semiconductor. Also, p-type or n-type dopants can be added to control the conductivity of each layer. After all of the semiconductor layers have been formed and, typically, after appropriate electric contacts have been applied, the wafer is cut into individual devices. Devices such as light-emitting diodes ("LEDs"), lasers, and other electronic and optoelectronic devices can be fabricated in this way.

In a typical chemical vapor deposition process, numerous wafers are held on a component commonly referred to as a wafer carrier so that a top surface of each wafer is exposed at the top surface of the wafer carrier. The wafer carrier is then placed into a reaction chamber and maintained at the desired temperature while the gas mixture flows over the surface of the wafer carrier. It is important to maintain uniform conditions at all points on the top surfaces of the various wafers on the carrier during the process. Minor variations in composition of the reactive gases and in the temperature of the wafer surfaces cause undesired variations in the properties of the resulting semiconductor devices.

For example, if a gallium indium nitride layer is deposited, variations in wafer surface temperature or concentrations of reactive gasses will cause variations in the composition and bandgap of the deposited layer. Because indium has a relatively high vapor pressure, the deposited layer will have a lower proportion of indium and a greater bandgap in those regions of the wafer where the surface temperature is higher. If the deposited layer is an active, light-emitting layer of an LED structure, the emission wavelength of the LEDs formed from the wafer will also vary. Thus, considerable effort has been devoted in the art heretofore towards maintaining uniform conditions.

One type of CVD apparatus which has been widely accepted in the industry uses a wafer carrier in the form of a large disc with numerous wafer-holding regions, each adapted to hold one wafer. The wafer carrier is supported on a spindle within the reaction chamber so that the top surface of the wafer carrier having the exposed surfaces of the wafers faces upwardly toward a gas distribution element. While the spindle is rotated, the gas is directed downwardly onto the top surface of the wafer carrier and flows across the top surface toward the periphery of the wafer carrier.

The wafer carrier is maintained at the desired elevated temperature by heating elements, typically electrical resistive heating elements disposed below the bottom surface of the wafer carrier. These heating elements are maintained at a temperature above the desired temperature of the wafer surfaces, whereas the gas distribution element typically is maintained at a temperature well below the desired reaction temperature so as to prevent premature reaction of the gases. Therefore, heat is transferred from the heating elements to the bottom surface of the wafer carrier and flows upwardly through the wafer carrier to the individual wafers.

The used gas is evacuated from the reaction chamber through exhaust ports disposed below the wafer carrier and distributed around the axis of the spindle, typically near the periphery of the chamber. The exhaust ports may have features that restrict the flow of gas into each port, which promotes a uniform flow of gas into the ports. In a conventional CVD reactor, parasitic deposition of products of the reactants can form on the exhaust ports. Such parasitic deposition can be periodically removed so that the reactant flow can remain as uniform as possible, thereby improving the uniformity of the process at the wafer surfaces. However, such removal typically requires disassembly of the reactor and thus lost production time.

Although considerable effort has been devoted in the art heretofore to optimization of such systems, still further improvement would be desirable. In particular, it would be desirable to provide better methods of cleaning the exhaust systems.

SUMMARY OF THE INVENTION

A chemical vapor deposition reactor and a method of wafer processing are provided. One aspect of the invention provides a chemical vapor deposition reactor. The reactor includes a reaction chamber having an interior, a gas inlet manifold communicating with the interior of the chamber, an exhaust system including an exhaust manifold having a passage and one or more ports, and one or more cleaning elements mounted within the chamber. The gas inlet manifold can admit process gasses to form a deposit on substrates held within the interior. The passage can communicate with the interior of the chamber through the one or more ports. The one or more cleaning elements can be movable between (i) a run position in which the cleaning elements are remote from the one or more ports and (ii) a cleaning position in which the one or more cleaning elements are engaged in the one or more ports.

In a particular embodiment, the chamber can have an entry port for insertion and removal of substrates and a shutter mounted to the chamber. In one example, the shutter can be movable between (i) an open position in which the shutter is clear of the entry port and (ii) a closed position in which the shutter blocks the entry port. In an exemplary embodiment, the one or more cleaning elements can be mounted to the shutter for movement therewith. In a particular example, the cleaning elements can be (i) in the run position when the shutter is in the closed position and (ii) in the cleaning position when the shutter is in the open position. Where the shutter moves vertically, the shutter typically is lowered to open it and raised to close it, and thus the open position can also be referred to as the "down" position and the closed position can also be referred to as the "up" position.

Another aspect of the invention provides a method of wafer processing. The method includes the steps of providing a reaction chamber, holding one or more wafers on a wafer carrier so that a top surface of each wafer is exposed at a top surface of the wafer carrier, applying one or more process gasses to the exposed top surfaces of the wafers, removing a portion of the process gasses through an exhaust system, moving one or more cleaning elements mounted within the chamber downward, and inserting at least a portion of each cleaning element into the exhaust manifold so as to clean the exhaust manifold. The reaction chamber can define an interior and can include an entry port for insertion and removal of wafer carriers. The exhaust system can include an exhaust manifold. The exhaust manifold can have having a passage and one or more ports. The passage can communicate with the interior of the chamber through the one or more ports.

In a particular embodiment, the method can include the step of moving a shutter mounted to the chamber from (i) an open position in which the shutter is clear of the entry port to (ii) a closed position in which the shutter blocks the entry port. In one example, the one or more cleaning elements can be directly joined to the shutter for movement therewith. In an exemplary embodiment, the step of moving a shutter can include moving the cleaning elements to (i) a run position when the shutter is in the closed position and (ii) a cleaning position when the shutter is in the open position.

BRIEF DESCRIPTION OF TEE DRAWINGS

DETAILED DESCRIPTION

Figure 1:
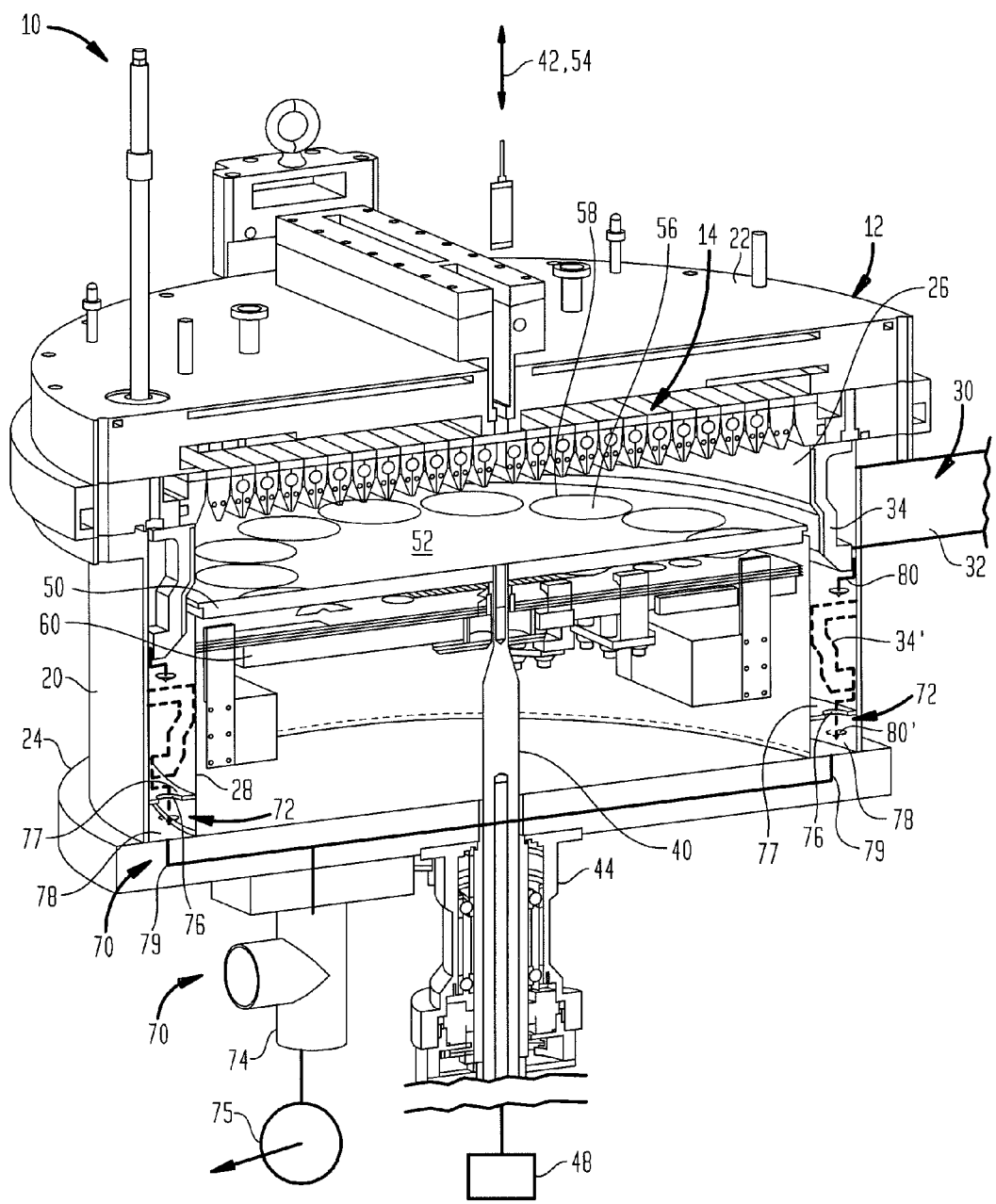
FIG. 1 is a perspective sectional view depicting chemical vapor deposition apparatus in accordance with one embodiment of the invention.
Figure 2:
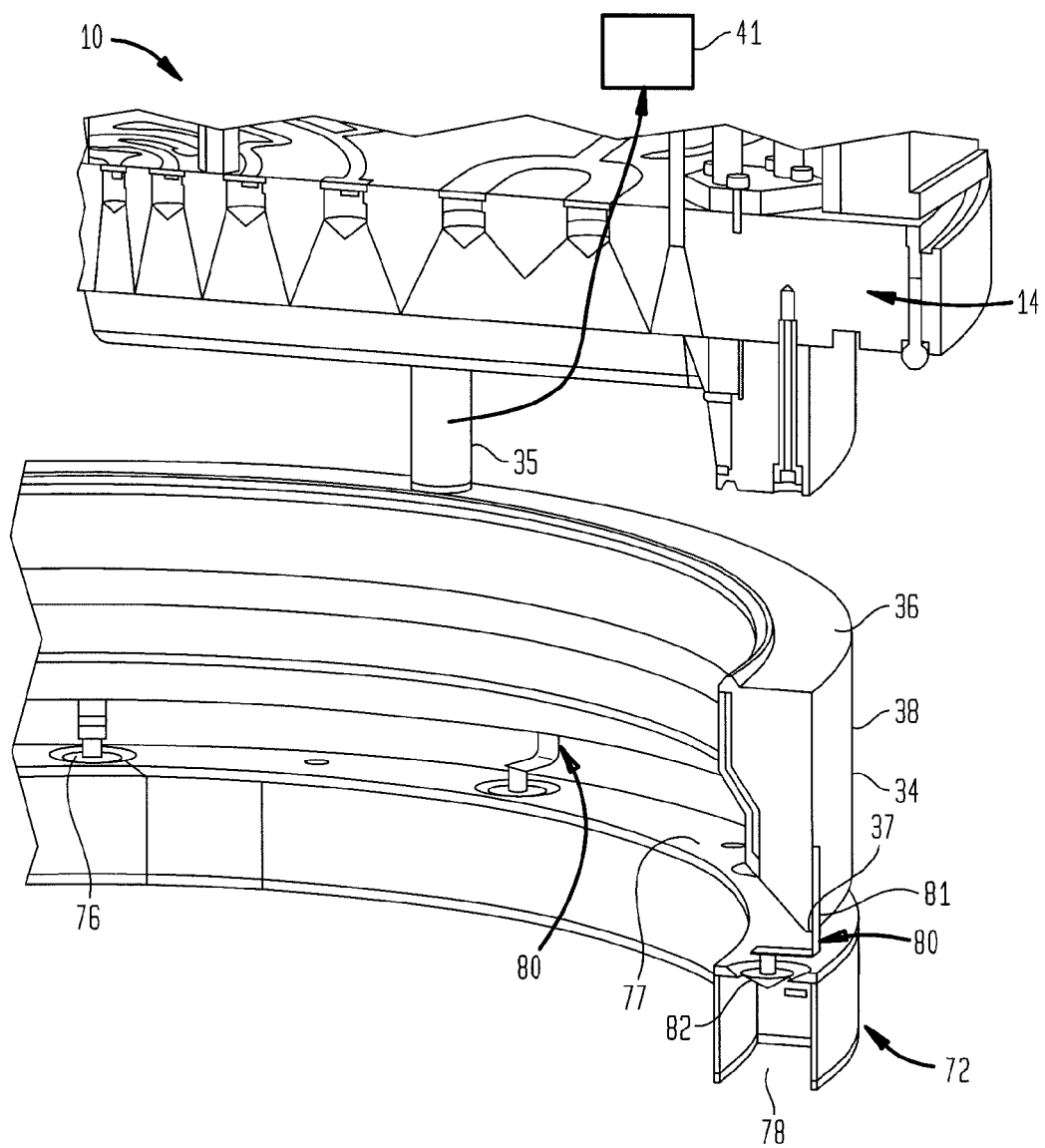
FIG. 2 is a fragmentary perspective sectional view depicting an embodiment of elements of the chemical vapor deposition apparatus illustrated in FIG. 1.
Figure 3:
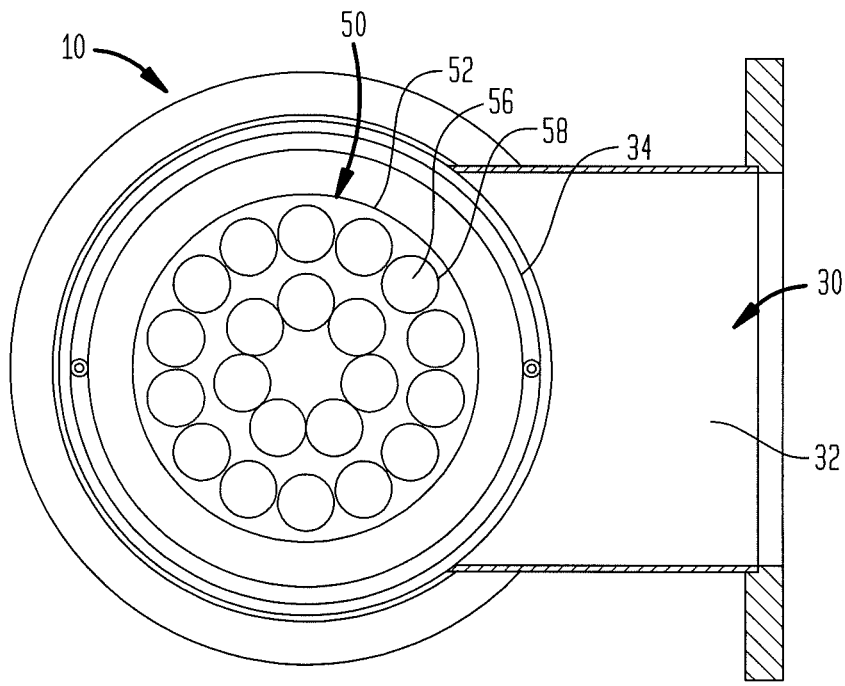
FIG. 3 is a top sectional view of the chemical vapor deposition apparatus illustrated in FIG. 1.

Referring to FIGS. 1-3, a chemical vapor deposition apparatus 10 in accordance with one embodiment of the invention includes a reaction chamber 12 having a gas inlet manifold 14 arranged at one end of the chamber 12. The end of the chamber 12 having the gas inlet manifold 14 is referred to herein as the "top" end of the chamber 12. This end of the chamber typically, but not necessarily, is disposed at the top of the chamber in the normal gravitational frame of reference. Thus, the downward direction as used herein refers to the direction away from the gas inlet manifold 14; whereas the upward direction refers to the direction within the chamber, toward the gas inlet manifold 14, regardless of whether these directions are aligned with the gravitational upward and downward directions. Similarly, the "top" and "bottom" surfaces of elements are described herein with reference to the frame of reference of chamber 12 and manifold 14.

The chamber 12 has a cylindrical wall 20 that extends between a top flange 22 at the top end of the chamber and a base plate 24 at the bottom end of the chamber. The wall 20, the flange 22, and the base plate 24 define an air-tight sealed interior region 26 therebetween that can contain gasses emitted from the gas inlet manifold 14. Although the chamber 12 is shown as cylindrical, other embodiments can include a chamber having another shape, including, for example, a cone or other surface of revolution, a square, a hexagon, an octagon, or any other appropriate shape.

The gas inlet manifold 14 is connected to sources for supplying process gases to be used in the wafer treatment process, such as a carrier gas and reactant gases such as a metalorganic compound and a source of a group V metal. In a typical chemical vapor deposition process, the carrier gas can be nitrogen, hydrogen, or a mixture of nitrogen and hydrogen, and hence the process gas at the top surface of a wafer carrier can be predominantly composed of nitrogen and/or hydrogen with some amount of the reactive gas components. The gas inlet manifold 14 is arranged to receive the various gases and direct a flow of process gasses generally in the downward direction.

The gas inlet manifold 14 can also be connected to a coolant system (not shown) arranged to circulate a liquid through the gas distribution element so as to maintain the temperature of the element at a desired temperature during operation. A similar coolant arrangement (not shown) can be provided for cooling the walls of chamber 12.

The chamber 12 is also provided with an entry opening 30 leading to an antechamber 32, and a shutter 34 for closing and opening the entry opening 30. The shutter 34 is movable between a closed position or up position shown in solid lines in FIG. 1, in which the door isolates the interior region 26 of the chamber 12 from the antechamber 32, and an open position or down position as shown in broken lines at 34' in FIG. 1.

The shutter 34 can be moveable by a control and actuation mechanism 41 (schematically depicted in FIG. 2) that is coupled to the shutter 34 by a linkage 35 (shown in FIG. 2). The control and actuation mechanism 41 can move the shutter 34 between the closed position shown in FIG. 1 and the open position shown as 34'. The control and actuation mechanism can include any type of actuator capable of moving linkage 35 and shutter 34 as for example, mechanical, electro-mechanical, hydraulic, or pneumatic actuators. As can be seen in FIG. 2, the shutter 34 defines an upper surface 36 facing the gas inlet manifold 14 and a lower edge 37 facing the exhaust manifold 72.

The shutter 34 can be configured as disclosed, for example, in U.S. Pat. No. 7,276,124, the disclosure of which is hereby incorporated by reference herein. Although the shutter 34 is shown as cylindrical, other embodiments can include a shutter having another shape, including, for example, a square, a hexagon, an octagon, or any other appropriate shape.

Referring again to FIG. 1, a spindle 40 is arranged within the chamber so that the central axis 42 of the spindle 40 extends in the upward and downward directions. The spindle is mounted to the chamber by a conventional rotary pass-through device 44 incorporating bearings and seals (not shown) so that the spindle can rotate about the central axis 42, while maintaining a seal between the spindle 40 and the base plate 24 of the chamber 12. The spindle 40 has a fitting 46 at its top end, i.e., at the end of the spindle closest to the gas inlet manifold 14. The fitting 46 is adapted to releasably engage a wafer carrier 50. In the particular embodiment depicted, the fitting 46 is a generally frustoconical element tapering toward the top end of the spindle 40 and terminating at a flat top surface.

The spindle 40 is connected to a rotary drive mechanism 48 such as an electric motor drive, which is arranged to rotate the spindle about the central axis 42. The spindle 40 can also be provided with internal coolant passages extending generally in the axial directions of the spindle within the gas passageway. The internal coolant passages can be connected to a coolant source, so that a fluid coolant can be circulated by the source through the coolant passages and back to the coolant source.

The wafer carrier 50 includes a body 52 which is substantially in the form of a circular disc having a central axis 54. In the operative position shown in FIGS. 1 and 3, the central axis 54 of the wafer carrier body 52 is coincident with the axis 42 of the spindle. The body 52 can be formed as a single piece or as a composite of plural pieces. For example, as disclosed in U.S. Published Patent Application No. 20090155028, the disclosure of which is hereby incorporated by reference herein, the wafer carrier body may include a hub defining a small region of the body 62 surrounding the central axis 54 and a larger portion defining the remainder of the disc-like body.

The wafer carrier body 52 can be formed from materials which do not contaminate the CVD process and which can withstand the temperatures encountered in the process. For example, the larger portion of the disc may be formed largely or entirely from materials such as graphite, silicon carbide, or other refractory materials. The body 52 has generally planar top and bottom surfaces extending generally parallel to one another and generally perpendicular to the central axis 54 of the disc. The body 52 also has a plurality of generally circular wafer-holding pockets 56 extending downwardly into the body 52 from the top surface thereof, each pocket adapted to hold a wafer 58. In one example, the wafer carrier body 52 can be about 500 mm to about 1000 mm in diameter.

A wafer 58, such as a disc-like wafer formed from sapphire, silicon carbide, or other crystalline substrate, is disposed within each pocket 56 of the wafer carrier 50. Typically, each wafer 58 has a thickness which is small in comparison to the dimensions of its major surfaces. For example, a circular wafer 58 about 2 inches (50 mm) in diameter may be about 430 μm thick or less. Each wafer 58 is disposed with a top surface thereof facing upwardly, so that the top surface is exposed at the top of the wafer carrier 50.

The apparatus 10 can further include a loading mechanism (not shown) capable of moving the wafer carrier 50 from the antechamber 32 into the chamber 12 and engaging the wafer carrier 50 with the spindle 40 in the operative condition, and also capable of moving the wafer carrier 50 off of the spindle 40 and into the antechamber 32.

A heating element 60 is mounted within the chamber 12 and surrounds the spindle 40 below the fitting 46. The heating element 60 can transfer heat to the bottom surface of the wafer carrier 50, principally by radiant heat transfer. Heat applied to the bottom surface of the wafer carrier 50 can flow upwardly through the body 52 of the wafer carrier 50 to the top surface thereof. Heat can pass upwardly to the bottom surface of each wafer 58, and upwardly through the wafer 58 to the top surface thereof. Heat can be radiated from the top surface of the wafer carrier 50 and from the top surfaces of the wafers 58 to the colder elements of the process chamber 12 as, for example, to the walls 20 of the process chamber 12 and to the gas inlet manifold 14. Heat can also be transferred from the top surface of the wafer carrier 50 and the top surfaces of the wafers 58 to the process gas passing over these surfaces. The chamber 12 also includes an outer liner 28 that reduces process gas penetration into the area of the chamber containing the heating element 60. In an example embodiment, heat shields (not shown) can be provided below the heating element 60, for example, disposed parallel to the wafer carrier 50, to help direct heat from the heating element upwards towards the wafer carrier 50 and not downwards towards the base plate 24 at the bottom end of the chamber 12.

The chamber 12 is also equipped with an exhaust system 70 arranged to remove spent gases from the interior region 26 of the chamber. The exhaust system 70 includes an exhaust manifold 72 at or near the bottom of the chamber 12. The exhaust manifold 72 is coupled to an exhaust conduit 74 that extends downward through the base plate 24 and is configured to carry spent gasses out of the reaction chamber 12.

As shown in FIG. 1, the exhaust manifold 72 extends around the periphery of the chamber 12 below the top of the spindle 40 and below the wafer carrier 50. The exhaust manifold 72 defines a channel 78. Although the channel 78 is shown as cylindrical or ring-shaped, other embodiments can include a channel 78 having another shape, including, for example, a square, a hexagon, an octagon, or any other appropriate shape.

The exhaust manifold 72 includes a plurality of ports in the form of round apertures 76 extending through a top surface 77 of the manifold 72 from the interior region 26 of the chamber 12 into the channel 78. The channel 78 is coupled to two exhaust ports 79 at diametrically opposed locations. Each exhaust port 79 extends between the channel 78 and the exhaust conduit 74. The conduit 74 in turn is connected to a pump 75 or other vacuum source.

The ports 76 are of relatively small diameter, as for example, about 0.5" to about 0.75". The ports 76 provide a low fluid conductance element that creates a flow rate restriction between the interior region 26 of the chamber 12 and the channel 78 of the exhaust manifold 72. The exhaust manifold 72 thus provides a pressure barrier between the interior region 26 of the chamber 12 and the exhaust ports 79, thereby providing increased uniformity of the flow of reactants inside of the chamber 12. Because the flow resistance within the channel 78 is small, the flows through all of the ports 76 are substantially equal. This provides a substantially uniform flow of waste gas into the channel 78 around the periphery of the chamber 12.

In a particular example, the exhaust manifold 72 can include approximately ten ports 76, each port 76 located approximately 36° apart from each adjacent port 76. In other embodiments, the exhaust manifold can include any number of ports, each port located any distance apart from each adjacent port. For example, there can be 6, 8, 12, 16, 20, 24, or 32 ports, each spaced equidistantly about the top surface of the exhaust manifold 72.

As shown, the exhaust manifold 72 includes ports 76 that are circular in shape. In other embodiments, the apertures in the exhaust manifold can define any shape, including for example, oval, parabolic, square, rectangular, triangular, hexagonal, octagonal, crescent-shaped, or S-shaped.

As shown, each port 76 extends horizontally across approximately three-quarters of the width of the top surface 77, in a radial direction from the central axis of the reaction chamber. In other embodiments, each port can extend across any portion of the width of the top surface of the exhaust manifold, including approximately half, two-thirds, four-fifths, or nine-tenths of the width of the top surface.

If a low fluid conductance element such as the ports 76 of the exhaust manifold 72 was not included in the chamber 12, the location of the two diametrically opposed exhaust ports 79 could cause a pressure gradient around the circumference of the chamber 12, thereby producing non-uniform gas flow across the wafer carrier 50, which can cause undesired variations in the properties of the resulting semiconductor wafers 58.

Use of the exhaust manifold 72 to provide flow rate restriction can result in parasitic deposition of solid particles (e.g., products of the reactants) formed in and around the ports 76 during operation of the apparatus 10. Such solid particles can reduce the size of or completely block some or all of the ports 76, which can cause non-uniform flow rates among various ports 76, which can result in undesired variations in the gas flow and thus affect the properties of the wafers 58 formed by the apparatus 10. Partial blockage of one or more of the ports 76 can also cause a non-uniform growth rate of the wafers 58.

The apparatus 10 further includes a plurality of cleaning elements in the form of plungers 80, each plunger extending downward from the shutter 34 from a location at or near the lower edge 37 thereof, such that the plungers 80 translate up and down with the shutter 34 relative to the exhaust manifold 72. Each plunger 80 is configured to clean solid particles from a respective port 76. Each plunger 80 can define a diameter that is approximately equal to or slightly smaller than a respective port 76, such that each plunger 80 can scrape solid particles off of the inside edge of the respective port 76 as the plunger 80 is translated up and down relative to the top surface 77 of the exhaust manifold 72.

As best shown in FIG. 2, each plunger 80 is attached to the shutter 34 at an outer surface 38 thereof, and each plunger 80 includes a shaft 81 that is bent inward and downward and a contact element in the form of a conical tip 82 at a lower end thereof. Having a conical tip 82 may allow the pluralities of plungers to self-locate relative to the respective ports 76 as the shutter 34 is moved downward, such that if the conical tips 82 are misaligned with the respective ports 76, the contact between the conical tips 82 and the top surface 77 can cause the plungers 80 to move the shutter 34 slightly horizontally until the plungers 80 can slide downward into the respective ports 76. The plunger shafts 81 desirably have sufficient flexibility in the horizontal direction to allow such self-centering.

As shown, each cleaning element 80 includes a tip 82 that is conical in shape, having a circular profile. In other embodiments, the contact element of each cleaning element can define any shape, including for example, oval, parabolic, square, rectangular, triangular, hexagonal, octagonal, crescent-shaped, or S-shaped.

As shown, the conical tip 82 is located at the lower end of each cleaning element 80. In other embodiments, the contact element of each cleaning element need not be located at a lower end thereof. In one example, each cleaning element can have a shaft and tip that have the same diameter and sectional profile, such that any part of the shaft can serve as a cleaning element. In another example, each cleaning element can have a contact element in the form of a radially-extending disc that is located between an upper and lower end thereof. In such an example, the lower end of the cleaning element can be moved downward into a port until the disc-shaped contact element contacts the port, thereby scraping solid particles off of the port.

Depending on the relative diameters of each tip 82 and a respective port 76, each plunger 80 can be fully inserted into a respective port 76 (e.g., wherein the diameter of the tip is less than or equal to the diameter of the port), or each plunger 80 can be partially inserted into a respective port 76 (e.g., wherein the diameter of the tip is greater than the diameter of the port). In embodiments where the diameter of the tip 82 is greater than the diameter of the respective port 76, the tip 82 can be lowered into the aperture until the periphery of the tip 82 contacts the top surface 77 of the exhaust manifold 72. Such a partial penetration of the tip 82 into a respective port 76 can effectively remove some or all of the solid particles that have become deposited in the port 76.

As shown in FIG. 2, each port 76 can have a chamfered edge. The angle of the chamfered edge of each port 76 can be any angle, but in some embodiments, the angle may approximately match the angle of the respective tip 82 (e.g., the angle of the chamfered edge of each port and the cone of each tip can be approximately 45 degrees. In such embodiments, where the diameter of the respective tip 82 is greater than the diameter of the port, the mating surfaces between the chamfered edge of the port and the conical tip can allow a greater surface area contact between the port and the tip, thereby allowing for the dislodging of a greater amount of solid particles from the port 76.

In operation, in a process according to an embodiment of the invention, the entry opening 30 is opened by lowering the shutter 34 to the open position 34', thereby lowering a plurality of plungers 80 into respective ports 76, thereby removing solid particles that may have deposited in the ports during a previous operation cycle of the apparatus.

Then, a wafer carrier 50 with wafers 58 loaded thereon is loaded from the antechamber 32 into the chamber 12 and is placed in the operative position shown in FIGS. 1 and 3. In this condition, the top surfaces of the wafers 58 face upwardly, towards the gas inlet manifold 14. The entry opening 30 is closed by raising the shutter 34 to the closed position depicted in solid lines in FIG. 1, thereby withdrawing the plungers 80 from the ports 76. The heating element 60 is actuated, and the rotary drive 48 operates to turn the spindle 40 and hence the wafer carrier 50 around central axis 42. Typically, the spindle 40 is rotated at a rotational speed from about 50-1500 revolutions per minute.

Process gas supply units (not shown) are actuated to supply gases through the gas inlet manifold 14. The gases pass downwardly toward the wafer carrier 50, over the top surface of the wafer carrier 50 and the top surfaces of the wafers 58, and downwardly around a periphery of the wafer carrier to the exhaust system 70 (which can result in solid particles being deposited in the ports 76). Thus, the top surface of the wafer carrier 50 and the top surfaces of the wafers 58 are exposed to a process gas including a mixture of the various gases supplied by the various process gas supply units. Most typically, the process gas at the top surface is predominantly composed of the carrier gas supplied by a carrier gas supply unit (not shown).

The process continues until the desired treatment of the wafers 58 has been completed. Once the process has been completed, the entry opening 30 is opened by lowering the shutter 34 to position 34', thereby lowering the plurality of plungers 80 into the respective ports 76, thereby removing solid particles that may have deposited in the ports 76 during the just-completed operation cycle of the apparatus. Once the entry opening 30 is open, the wafer carrier 50 can be removed from the spindle 40 and can be replaced with a new wafer carrier 50 for the next operational cycle. The structure and method described above provide effective cleaning of the flow-restriction ports 76 of the exhaust system 70 during the normal operational cycle. This avoids or minimizes the need to disassemble the system in order to clean the ports 76.

In other embodiments (not shown), the plungers can move up and down relative to the exhaust manifold independently of the shutter. For example, the plungers can be attached to a bracket (e.g., a cylindrical bracket) that is located between the shutter and the exhaust manifold. The bracket can be moved up and down by a control and actuation mechanism that is coupled to the reaction chamber by a linkage similar to the linkage 35 shown in FIG. 2. However, use of the shutter itself to move the cleaning elements as discussed above considerably simplifies the design and operation of the reactor.

In embodiments where the plungers can move up and down relative to the exhaust manifold independently of the shutter, it is not necessary that the plungers be moved into the apertures of the exhaust manifold following each operational cycle. In such embodiments, the plungers can moved downward to clean the apertures after any number of cycles, including for example, after two, three, four, five, eight, ten, fifteen, or twenty operational cycles.

In a further variation, the plungers 80 may be mounted to the shutter 34, but the shutter 34 and the control and actuation mechanism 41 are arranged so that in the normal open position of the shutter 34, the plungers 80 remain above the ports 76. The control and actuation mechanism 41 can be arranged to move the shutter 34 downwardly beyond its normal open position to a special port-cleaning position, where the plungers 80 are engaged in the ports 76. Movement to the cleaning position can be used as needed, either in every cycle or intermittently.

Figure 4:
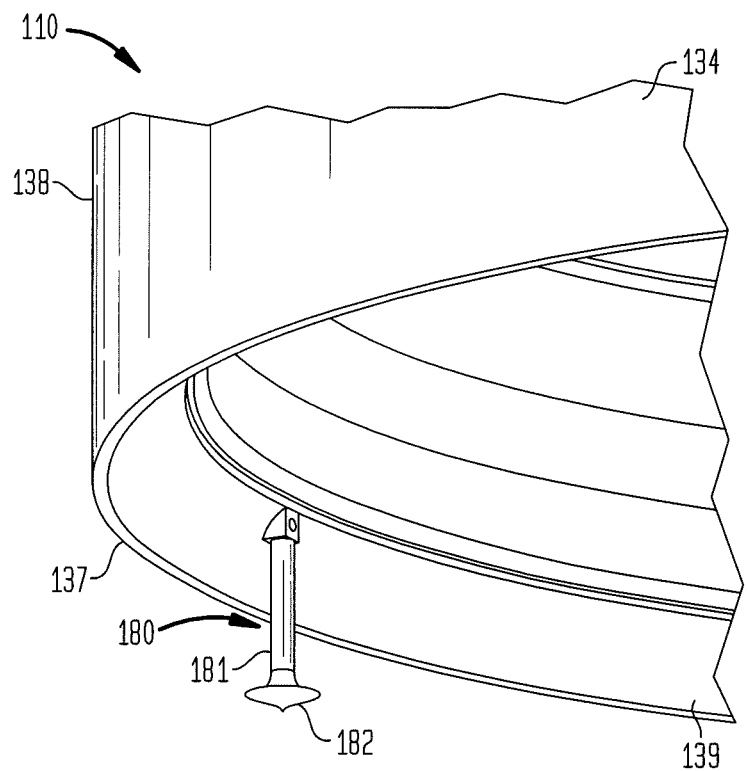
FIG. 4 is a fragmentary perspective sectional view depicting another embodiment of the elements shown in FIG. 2.

The shutter 134 shown in FIG. 4 can be used in place of the shutter 34 shown in FIGS. 1-3. The shutter 134 is the same as the shutter 34 except that the plunger 180 extending downward near the lower edge 137 is attached to the shutter 134 at an inner surface 139 thereof, rather than at an outer surface 138. The plunger 180 includes a shaft 181 that extends straight down along the inner surface 139, and the shaft 181 terminates in a contact element shown in the form of a conical tip 182.

As shown in FIGS. 1, 2, and 4, the plungers 80 and 180 extend downward from the shutters 34 and 134 for contact with respective ports. However, in other embodiments, the lower edge of the shutter can be shaped to function as the plungers, such that the plungers are integrated into the shape of the lower edge of the shutter as a single component. For example, the lower edge of the shutter can include plunger-like protrusions extending downward towards respective ports, such that when the shutter is moved downward to clean solid particles from the ports, a portion or all of each plunger-like protrusion can be inserted into a respective port, thereby scraping solid particles from the respective port.

Figure 5A:
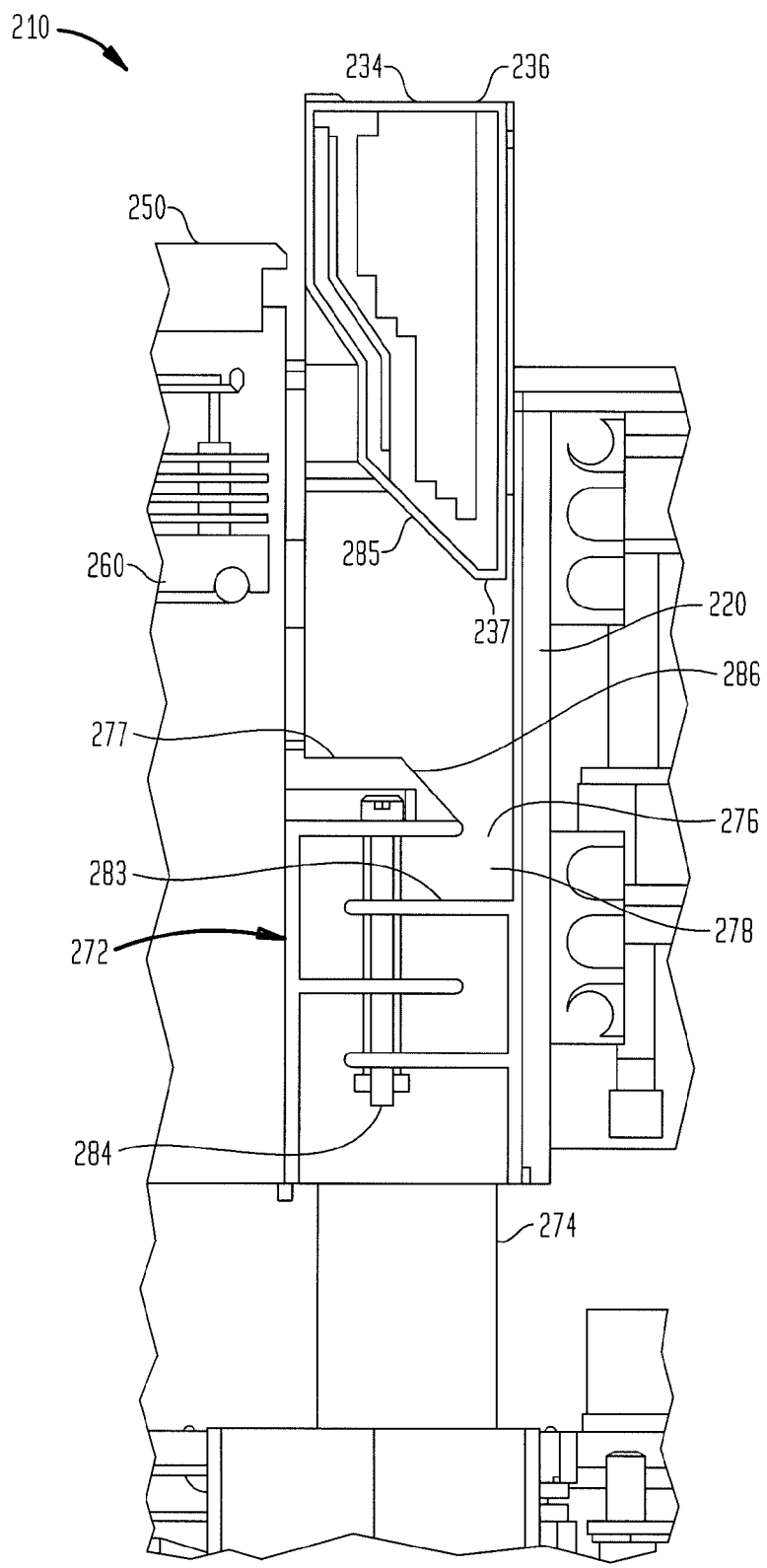
FIG. 5A is a fragmentary side sectional view depicting portions of an apparatus according to a further embodiment of the invention in one position.
Figure 5B:
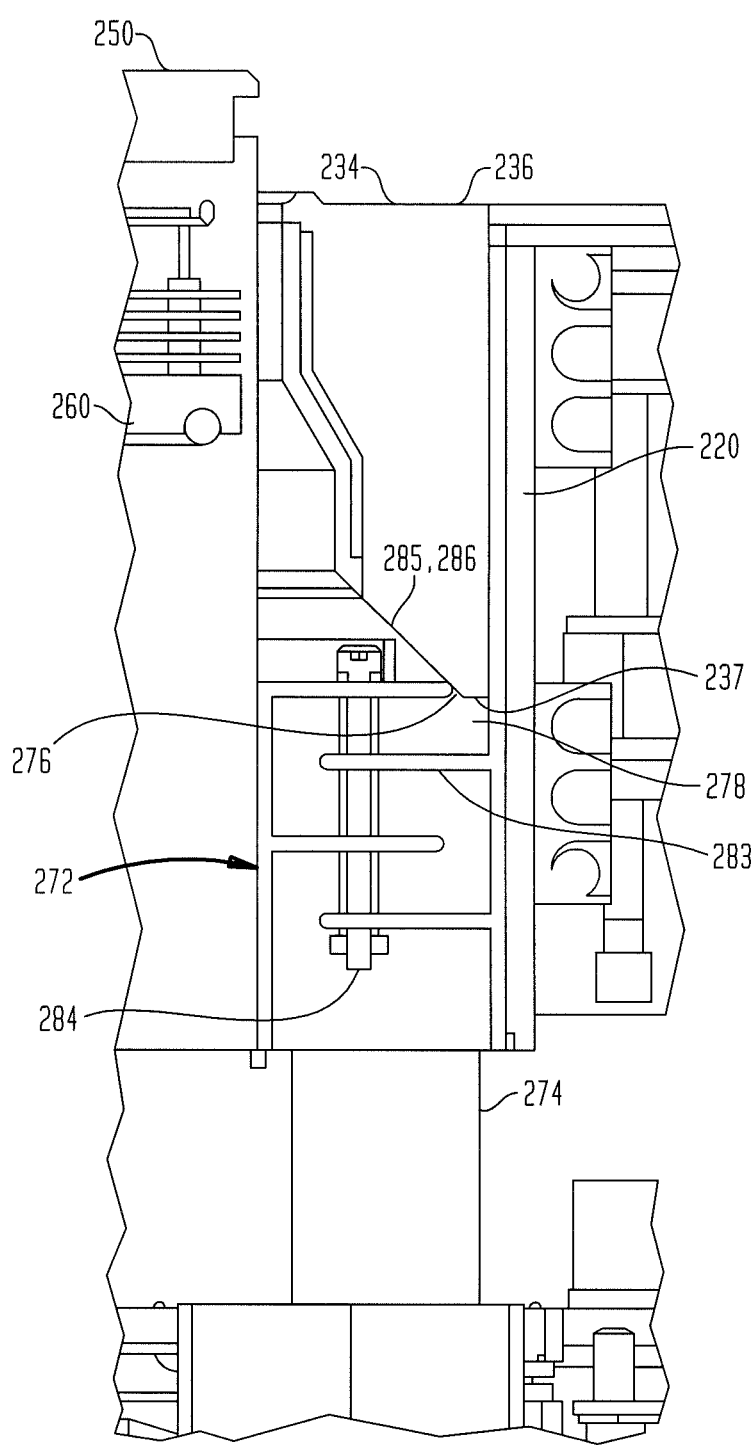
FIG. 5B is a fragmentary side sectional view of the apparatus of FIG. 5A, shown in a different position.

Referring now to FIGS. 5A and 5B, a chemical vapor deposition apparatus 210 in accordance with an embodiment of the invention includes a shutter 234 to be used in a wafer treatment process in a reaction chamber such as the reaction chamber 12 shown in FIG. 1. The shutter 234 shown in FIGS. 5A (open shutter position) and 5B (closed shutter position) is similar to the shutter 34 shown in FIGS. 1-3, except that the shutter 234 does not include plungers extending downward from an edge thereof, and the exhaust system includes a labyrinth having a single ring-shaped port rather than a manifold having plurality of round ports.

The apparatus 210 includes a shutter 234 for closing and opening an entry opening such as the entry opening 30 shown in FIGS. 1 and 3. The shutter 234 defines an upper surface 236 facing a gas inlet manifold (not shown) and a lower edge 237 facing an exhaust labyrinth 272.

The exhaust labyrinth 272 includes a single port 276 (e.g., a ring-shaped port) extending through a top surface 277 of the labyrinth 272 into a channel 278 (e.g., a ring-shaped channel) having a plurality of baffles 283 that are coupled together by a bolt 284. The channel 278 is coupled to an exhaust conduit 274 and exhaust ports configured to remove spent gases from the interior region of the chamber.

The exhaust labyrinth 272 and the included baffles 283 are configured to provide a low fluid conductance element that creates a flow rate restriction between the interior region of the reaction chamber and the exhaust conduit 274. The exhaust labyrinth 272 and the included baffles 283 can provide a pressure barrier between the interior region of the chamber and the exhaust conduit 274, thereby providing increased uniformity of the flow of reactants inside of the chamber.

Rather than having individual plungers coupled to the shutter (as shown in FIGS. 1-4), the lower edge 237 of the shutter 234 is moveable relative to the exhaust labyrinth 272, and is configured to contact the single port 276 of the exhaust labyrinth 272 to dislodge, clean, or scrape solid particles therefrom.

The lower edge 237 of the shutter 234 is configured such that when the shutter 234 is lowered (e.g., to open the reaction chamber for insertion or removal of a wafer carrier), a portion of the shutter 234 can be inserted into the single port 276, thereby scraping solid particles therefrom. The lower edge 237 can define a width (in a direction perpendicular to the central axis of the reaction chamber) that is approximately equal to or slightly smaller than the width of the port 276. In such an embodiment, the lower edge 237 can partially fit inside of the port 276 and can scrape solid particles off of the inside edges of the port 276 as the shutter 234 is translated up and down relative to the top surface 277 of the labyrinth 272.

Having a chamfered inner edge 285 adjacent the lower edge 237 of the shutter 234, and having a chamfered inner edge 286 of the port 276 may allow the shutter 234 to self-locate relative to the port 276 as the shutter 234 is moved downward. In such an embodiment, if the shutter 234 is misaligned with the port 276, the contact between the chamfered inner edges 285 and 286 can cause the shutter 234 to move slightly horizontally until lower edge 237 thereof can slide downward partially into the port 276.

The angle of the chamfered inner edge 285 of the shutter 234 and the chamfered inner edge 286 of the port 276 can be any angles, but in some embodiments, the angle of the chamfered inner edges 285 and 286 may approximately match each other (e.g., the angle of the chamfered inner edges 285 and 286 can be approximately 45 degrees to the central axis of the chamber). In such embodiments, the mating chamfer inner edges 285 and 286 can allow a greater surface area contact between the shutter 234 and the port 276, thereby allowing for the dislodging of a greater amount of solid particles from the port 276.

As shown, the exhaust labyrinth 272 includes a single port 276 extending around the entire exhaust labyrinth 272. In other embodiments, the exhaust labyrinth can include a plurality of spaced apart arc-shaped ports extending around the labyrinth. For example, the exhaust labyrinth can include ten spaced apart arc-shaped ports, each spanning approximately 30 degrees, and each separated by 6 degrees of the top surface of the exhaust labyrinth. In such an embodiment, the lower edge of the shutter may include ten lowered portions, each lowered portion configured to fit into a corresponding arc-shaped port, such that the shutter can clean solid particles from the arc-shaped ports when the shutter contacts the exhaust labyrinth.

As shown, the port 276 extends horizontally across approximately one-quarter of the width of the top surface 277, in a radial direction from the central axis of the reaction chamber. In other embodiments, the port can extend across any portion of the width of the top surface of the exhaust manifold, including approximately half, two-thirds, four-fifths, or nine-tenths of the width of the top surface.

As shown in FIGS. 5A and 5B, the shutter 234 translates up and down relative to the exhaust labyrinth 272 for contact therewith and dislodging of solid particles. In other embodiments (not shown), a separate cleaning element (e.g., a cylindrical-shaped cleaning element) can move up and down relative to the exhaust labyrinth independently of the shutter. For example, a cylindrical bracket that is located between the shutter and the exhaust labyrinth can move up and down and contact the exhaust labyrinth to dislodge sold particles. The bracket can be moved by a control and actuation mechanism that is coupled to the reaction chamber by a linkage such as the linkage 35 shown in FIG. 2.

As shown, the shutter 234 has a width greater than the width of the port 276, such that only the lower edge 277 and part of the chamfered inner edge 285 can be inserted into the aperture 276 to dislodge solid particles therefrom. In other embodiments (not shown), the entire lower edge and chamfered inner edge of the shutter may be able to be inserted into the port (e.g., wherein the width of the shutter is less than or equal to the width of the aperture).

As shown, there are three baffles 283 located inside of the exhaust labyrinth 272. In other embodiments, there can be any number of baffles located inside of the exhaust labyrinth, depending on the degree of gas flow restriction between the inner region of the reaction chamber and the exhaust conduit that is desired.

The invention can be applied in various wafer treatment processes as, for example, chemical vapor deposition, chemical etching of wafers, and the like.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims. It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A chemical vapor deposition reactor comprising:
   (a) a reaction chamber having an interior;
   (b) a gas inlet manifold communicating with the interior of the chamber for admitting process gasses to form a deposit on substrates held within the interior;
   (c) an exhaust system including an exhaust manifold having a passage and one or more ports, the passage communicating with the interior of the chamber through the one or more ports; and
   (d) one or more cleaning elements mounted within the chamber, the one or more cleaning elements being movable between (i) a run position in which the cleaning elements are remote from the one or more ports and (ii) a cleaning position in which the one or more cleaning elements are engaged in the one or more ports.

2. A reactor as claimed in claim 1, wherein the chamber has an entry port for insertion and removal of substrates and a shutter mounted to the chamber and movable between (i) an open position in which the shutter is clear of the entry port and (ii) a closed position in which the shutter blocks the entry port, and the one or more cleaning elements are mounted to the shutter for movement therewith.

3. A reactor as claimed in claim 2, wherein the cleaning elements are (i) in the run position when the shutter is in the closed position and (ii) in the cleaning position when the shutter is in the open position.

4. A reactor as claimed in claim 2, wherein the exhaust manifold defines a ring shape and the one or more ports includes a plurality of round apertures.

5. A reactor as claimed in claim 4, wherein the one or more cleaning elements is a plurality of plungers attached to the shutter.

6. A reactor as claimed in claim 5, wherein each plunger has a conical tip.

7. A reactor as claimed in claim 6, wherein each conical tip defines an angle relative to a central axis of the chamber that is approximately equal to the angle defined by a chamfered inner edge of each of the plurality of round apertures.

8. A reactor as claimed in claim 2, wherein the exhaust manifold includes a labyrinth including a plurality of baffles and the one or more ports is a single cylindrical aperture.

9. A reactor as claimed in claim 8, wherein the one or more cleaning elements is a lower portion of the shutter.

10. A reactor as claimed in claim 9, wherein the lower portion of the shutter has a chamfered inner edge.

11. A reactor as claimed in claim 10, wherein the chamfered inner edge of the lower portion of the shutter defines an angle relative to a central axis of the reactor that is approximately equal to the angle defined by a chamfered inner edge of the aperture of the exhaust manifold.

12. A reactor as claimed in claim 1, further comprising a spindle mounted within the chamber configured to rotate about an axis extending in upward and downward directions, an upper end of the spindle configured to releasably engage a wafer carrier configured to hold a plurality of wafers.

13. A reactor as claimed in claim 12, further comprising a motor drive configured to rotate the spindle about the axis.

14. A reactor as claimed in claim 12, further comprising a heater configured to heat the wafer carrier.

* * * * *